(12) United States Patent
Kim et al.

(10) Patent No.: US 9,837,343 B2
(45) Date of Patent: Dec. 5, 2017

(54) CHIP EMBEDDED SUBSTRATE

(71) Applicant: SAMSUNG ELECTRO-MECHANICS CO., LTD., Suwon-Si, Gyeonggi-Do (KR)

(72) Inventors: Joon Sung Kim, Suwon-Si (KR); Yong Ho Baek, Seoul (KR); Jung Hyun Cho, Busan (KR); Eung Suek Lee, Anyang-si (KR); Jae Hoon Choi, Yongin-si (KR); Young Gwan Ko, Seoul (KR)

(73) Assignee: SAMSUNG ELECTRO-MECHANICS CO., LTD., Gyeonggi-Do (KR)

( * ) Notice: Subject to any disclaimer, the term of this patent is extended or adjusted under 35 U.S.C. 154(b) by 169 days.

(21) Appl. No.: 14/754,363

(22) Filed: Jun. 29, 2015

(65) Prior Publication Data

US 2016/0007449 A1     Jan. 7, 2016

(30) Foreign Application Priority Data

Jul. 2, 2014    (KR) ........................ 10-2014-0082698

(51) Int. Cl.
| | | |
|---|---|---|
| *H05K 1/18* | (2006.01) | |
| *H01L 23/498* | (2006.01) | |
| *H01L 21/48* | (2006.01) | |
| *H01L 23/538* | (2006.01) | |
| *H01L 23/00* | (2006.01) | |

(Continued)

(52) U.S. Cl.
CPC .... *H01L 23/49827* (2013.01); *H01L 21/4846* (2013.01); *H01L 23/5389* (2013.01); *H01L 24/25* (2013.01); *H01L 24/82* (2013.01); *H05K 3/4602* (2013.01); *H01L 23/13* (2013.01); *H01L 2224/04105* (2013.01); *H01L 2224/2518* (2013.01); *H01L 2224/32225* (2013.01); *H01L 2224/83005* (2013.01); *H01L 2224/92144* (2013.01); *H01L 2924/14* (2013.01); *H01L 2924/15153* (2013.01); *H01L 2924/3511* (2013.01); *H05K 1/185* (2013.01); *H05K 3/305* (2013.01); *H05K 2201/09227* (2013.01); *H05K 2203/1469* (2013.01); *H05K 2203/167* (2013.01)

(58) Field of Classification Search
CPC .......... H05K 1/14; H05K 1/141; H05K 1/144; H05K 1/162; H05K 1/167; H05K 2924/01079
USPC .......... 361/792–795, 760–766; 174/259–264
See application file for complete search history.

(56) References Cited

U.S. PATENT DOCUMENTS 8,130,508 B2 *   3/2012   Kim .................. H01L 24/97
                                                361/763
9,462,697 B2 * 10/2016   Chung ................ H05K 1/186
(Continued)

FOREIGN PATENT DOCUMENTS

KR    10-2004-0073606 A    8/2004

*Primary Examiner* — Tuan T Dinh
(74) *Attorney, Agent, or Firm* — McDermott Will & Emery LLP

(57) ABSTRACT

A chip embedded substrate includes: an insulating layer having outer layer circuit patterns provided on any one of an upper surface and a lower surface thereof; a chip embedded in the insulating layer; and internal circuit patterns included in the insulating layer and disposed between a height of a top surface of the chip and a height of a bottom surface thereof.

5 Claims, 5 Drawing Sheets

(51) Int. Cl.
*H05K 3/46* (2006.01)
*H01L 23/13* (2006.01)
*H05K 3/30* (2006.01)

(56) References Cited

U.S. PATENT DOCUMENTS

| | | | | |
|---|---|---|---|---|
| 2006/0054352 A1* | 3/2006 | Ryu | ........................ | H05K 1/185 |
| | | | | 174/260 |
| 2008/0106879 A1* | 5/2008 | Ryu | .................... | H01L 23/5389 |
| | | | | 361/783 |
| 2012/0186866 A1* | 7/2012 | Mikado | .................. | H05K 1/185 |
| | | | | 174/260 |

* cited by examiner

CHIP EMBEDDED SUBSTRATE

This application claims the benefit under 35 U.S.C. Section [120, 119, 119(e)] of Korean Patent Application Serial No. 10-2014-0082698 entitled "Chip Embedded Substrate and Method of Manufacturing the Same" filed on Jul. 2, 2014, which is hereby incorporated by reference in its entirety into this application.

BACKGROUND OF THE INVENTION

1. Technical Field

The present invention relates to a substrate, and more particularly, to a chip embedded substrate and a method of manufacturing the same.

2. Description of the Related Art

In accordance with a recent trend of miniaturization, thinness, and lightness of an electronic device, miniaturization and lightness of a printed circuit board (PCB) is also required. In a printed circuit board for package, an embedding substrate in which a passive element such as a capacitor as well as an active element such as an integrated chip (IC) are embedded in the printed circuit board has been gradually increased.

In the case in which a chip is embedded in the substrate, there are advantages that a size of an electronic component is reduced to help miniaturization and lightness of a product, an operation frequency of a circuit may be increased by removing parasitic components, and the effect of external electromagnetic wave causing noise may be intercepted.

Further, as a market of portable electronic devices such as smartphones, smart pads, and the like is explosively growing, a chip embedded substrate capable of meeting a specification requirement of slimness and lightness products has been highlighted.

As the related art in which cavities are processed in the substrate and the chips are then embedded in the cavities, there is a technology (hereinafter, referred to as 'the related art') disclosed in Korean Patent Laid-Open Publication No. 10-2004-0073606. The related art has a gist of a technology of manufacturing the cavity penetrating through the substrate and then attaching an adhesive tape to a lower surface of the substrate, seating the aligned chips in the cavity and then filling the cavity with a resin, and removing the adhesive tape once the chips are fixed.

According to the manufacturing method described above, wiring layers are provided to upper and lower portions of a core layer in which the components are embedded and a build-up process is performed for the upper and lower portions of the core layer, thereby completing a multilayer substrate. In this case, there is a limit in implementing high density of the wiring layer.

SUMMARY OF THE INVENTION

An object of the present invention is to provide a chip embedded substrate that meets high density of a circuit by additionally designing a wiring layer in an insulating layer in which a chip is embedded, and a method of manufacturing the same.

According to an exemplary embodiment of the present disclosure, there is provided a chip embedded substrate capable of increasing circuit density by including internal circuit patterns in an insulating layer in which the chip is embedded, specifically, between a height of a top surface of the chip and a height of a bottom surface thereof.

A chip embedded substrate having internal circuit patterns formed in a plurality of layers depending on a thickness of a chip may be provided as another exemplary embodiment.

Outer layer circuit patterns are formed on at least one of an upper surface and a lower surface of the insulating layer, and according to the present invention having the structure described above, there is provided a chip embedded substrate in which the chip and the outer layer circuit patterns are electrically connected through a first via formed therebetween, and the internal circuit patterns and the outer layer circuit patterns are electrically connected to each other through a second via formed therebetween.

According to an exemplary embodiment of the present disclosure, there is provided a method of manufacturing a chip embedded substrate including: forming internal circuit patterns and a groove on the lower insulating layer; mounting a chip in the groove; and stacking an upper insulating layer on the lower insulating layer so as to cover the internal circuit patterns including the chip.

The groove formed in the upper insulating layer may have a depth smaller than a thickness of the mounted chip, and the present invention provides a chip embedded substrate in which the internal circuit patterns are disposed between a height of a top surface of the chip and a height of a bottom surface thereof.

BRIEF DESCRIPTION OF THE DRAWINGS

FIG. 3A is a cross-sectional view of an upper insulating layer, and FIG. 3B is a cross-sectional view of a lower insulating layer;

DESCRIPTION OF THE PREFERRED EMBODIMENTS

Figure 1:
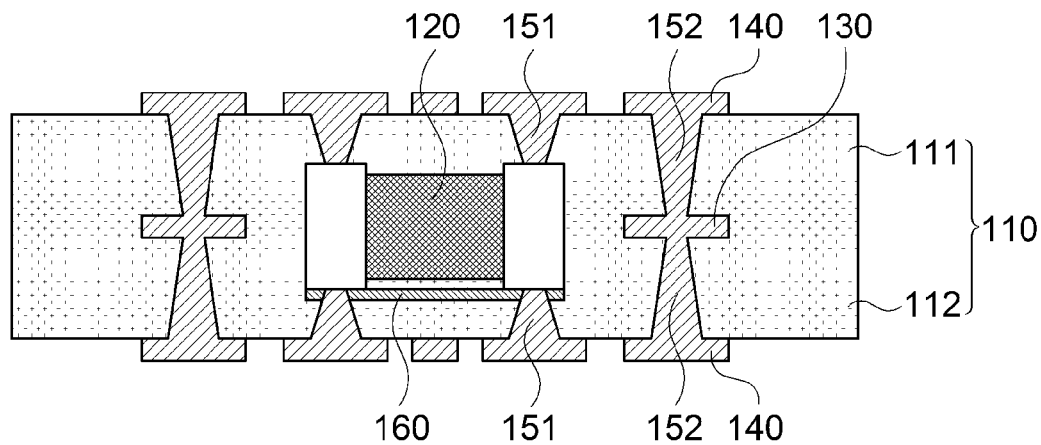
FIG. 1 is a cross-sectional view of a chip embedded substrate according to the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the present invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word 'comprise' and 'comprising' used in the present specification will be understood to imply the inclusion of stated components, steps, operations and elements but not the exclusion of any other components, steps, operations and elements.

Hereinafter, a configuration and an acting effect of exemplary embodiments of the present invention will be described in more detail with reference to the accompanying drawings.

FIG. 1 is a cross-sectional view of a chip embedded substrate according to the present invention. For reference, components shown in the accompanying drawings are not necessarily shown to scale. For example, sizes of some components shown in the accompanying drawings may be exaggerated as compared with other components in order to assist in the understanding of the exemplary embodiments of the present invention.

Referring to FIG. 1, a chip embedded substrate 100 according to the present invention includes an insulating layer 110, a chip 120 embedded in the insulating layer 110, and internal circuit patterns 130 disposed at predetermined positions in the insulating layer 110.

The insulating layer 110 may be a core layer included in a single sided printed circuit board, a double sided printed circuit board, a multilayer printed circuit board, or the like, or may be any one of a plurality of build-up layers stacked on the core layer. For example, FIG. 1 shows only a single insulating layer in which the chip is embedded, among a plurality of insulating layers configuring the substrate in order to clearly show features of the present invention, wherein the insulating layer 110 itself of FIG. 1 may be the substrate or the build-up layer may also be stacked on the insulting layer 110.

As a material forming the insulating layer 110, a thermosetting resin such as epoxy, a thermoplastic resin such as polyimide, other photo-curable resins, or the like may be used. Particularly, in the case in which the insulating layer 110 becomes the core layer of the substrate, a prepreg having a reinforcement material such as a glass fiber or an inorganic filler impregnated in the above-mentioned resins may be used.

An outer layer circuit pattern 140 is provided onto at least one surface of an upper surface and a lower surface of the insulating layer 110.

The outer layer circuit pattern 140, which is a two-dimensionally patterned metal wiring, may become a ground wiring forming a ground region, a power wiring becoming a power supplying means, a signal wiring performing a signal transfer function, and the like depending on the usage thereof, and a portion of the outer layer circuit pattern 140 may become a pad which is electrically connected to mounting components.

In the case in which the outer layer circuit patterns 140 are provided onto both the upper surface and the lower surface of the insulating layer 110, the chip embedded substrate according to the present invention becomes a substrate configured in a total of three wiring layers, including the internal circuit patterns 130.

Figure 2:
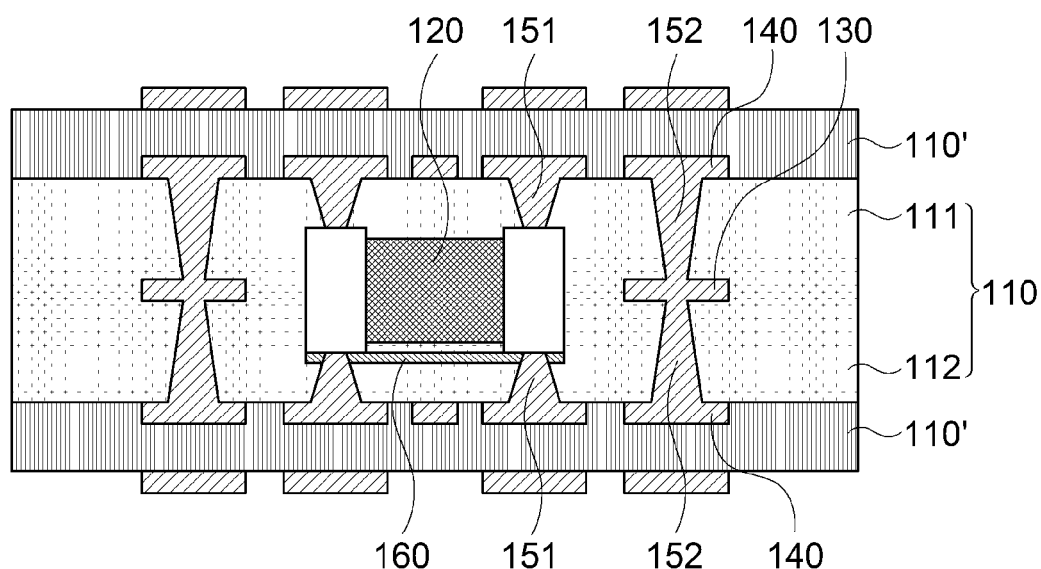
FIG. 2 is a view showing an example in which build-up layers according to the present invention are stacked.

FIG. 2 shows an example in which build-up layers 110' are stacked on the insulating layer 110 of FIG. 1. In this case, the chip embedded substrate according to the present invention includes circuit patterns included in the build-up layers 110', thereby becoming a substrate configured in a total of five wiring layers.

As such, the chip embedded substrate according to the present invention has the wiring layers that are increased by an odd unit such as five layers, seven layers, or nine layers whenever the build-up layers are stacked. In case of the substrate according to the related art, since the wiring layers are provided onto the upper and lower portions of the core layer and the build-up layers are stacked thereon, the wiring layers are increased by an even unit such as four layers, six layers, or eight layers. Therefore, since the chip embedded substrate 100 according to the present invention may design the wiring layer further having one layer as compared to the substrate according to the related art, it is advantageous to implement high density of the circuit.

The chip 120 embedded in the insulating layer 110 may be appropriately selected from an active element such as an integrated circuit (IC) chip or a passive element such as a resistor, a capacitor, an inductor, or the like. In addition, although the case in which only one chip 120 is embedded has been described in the present exemplary embodiment, it is merely one example and the number of chips is not limited.

The chip 120 has top and bottom surfaces embedded in the insulating layer 110 so as to be entirely buried. Therefore, the upper surface of the insulating layer 110 and the top surface of the chip 120 are spaced apart from each other by a predetermined interval and the lower surface of the insulating layer 110 and the bottom surface of the chip 120 are also spaced apart from each other by a predetermined interval.

In the structure as described above, the chip 120 and the outer layer circuit patterns 140 may be electrically connected to each other through first vias 151 formed therebetween. The first via 151 is formed in a taper shape in which a diameter thereof is decreased toward the chip 120. Therefore, the first via 151 formed between the chip 120 and the upper surface of the insulating layer 110 and the first via 151 formed between the chip 120 and the lower surface of the insulating layer 110 are formed in a structure which is symmetrical with each other while having the chip 120 therebetween.

Figure 3A:
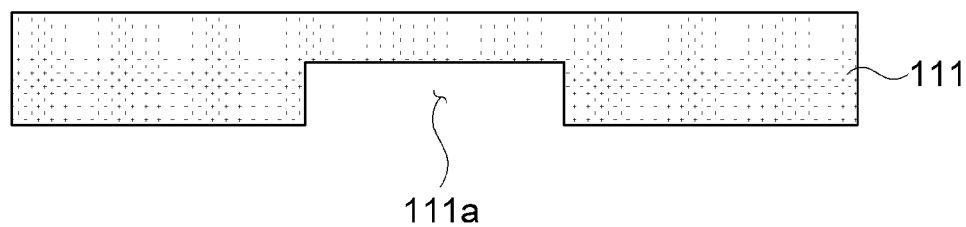
FIGS. 3A and 3B are views for describing a configuration of an insulating layer included in the present invention.
Figure 3B:
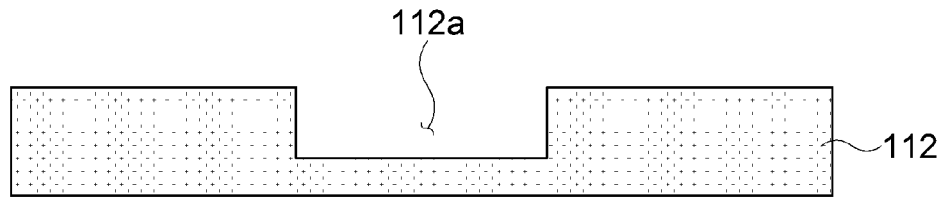

FIGS. 3A and 3B are views for describing an upper insulating layer and a lower insulating layer configuring the insulating layer 110, FIG. 3A is a cross-sectional view of the upper insulating layer, and FIG. 3B is a cross-sectional view of the lower insulating layer.

Referring to FIGS. 3A and 3B, the insulating layer 110 includes an upper insulating layer 111 in which a groove 111a enclosing an upper end portion of the chip 120 is formed and a lower insulating layer 112 in which a groove 112a enclosing a lower end portion of the chip 120 is formed. That is, the insulating layer 110 is completed by bonding the upper insulating layer 111 on the lower insulating layer 112 at the time of the manufacturing of the insulating layer 110, wherein the upper insulating layer 111 and the lower insulating layer 112 are formed of the same resin material and are bonded so as not to identify a boundary therebetween.

Once the upper insulating layer 111 and the lower insulating layer 112 are bonded, a closed space in which the chip 120 is to be accommodated is formed by the groove 111a of the upper insulating layer 111 and the groove 112a of the lower insulating layer 112.

Here, an adhesive 160 is provided onto a bottom surface of the groove 112a of the lower insulating layer 112 and the chip 120 may be mounted thereon. The adhesive 160 serves to fix the chip 120 and is made of epoxy, silicon (Si) rubber, polyimide (PI), or the like.

The internal circuit patterns 130 are disposed between the upper insulating layer 111 and the lower insulating layer 112. The groove 112a of the lower insulting layer 112 has a depth smaller than a thickness of the chip 120. Therefore, the internal circuit patterns 130 are disposed between a height of the top surface of the chip 120 and a height of the bottom surface thereof.

The internal circuit patterns 130 and the outer layer circuit patterns 140 are electrically connected to each other through second vias 152 formed therebetween.

The second via 152 is formed in a taper shape in which a diameter thereof is decreased toward the internal circuit pattern 130. Therefore, the second via 152 formed between the internal circuit pattern 130 and the upper surface of the insulating layer 110 and the second via 152 formed between the internal circuit pattern 130 and the lower surface of the insulating layer 110 are formed in a structure which is symmetrical with each other while having the internal circuit pattern 130 therebetween.

As another exemplary embodiment of the present invention, the internal circuit pattern 130 may be formed in a plurality of layers.

Figure 4:
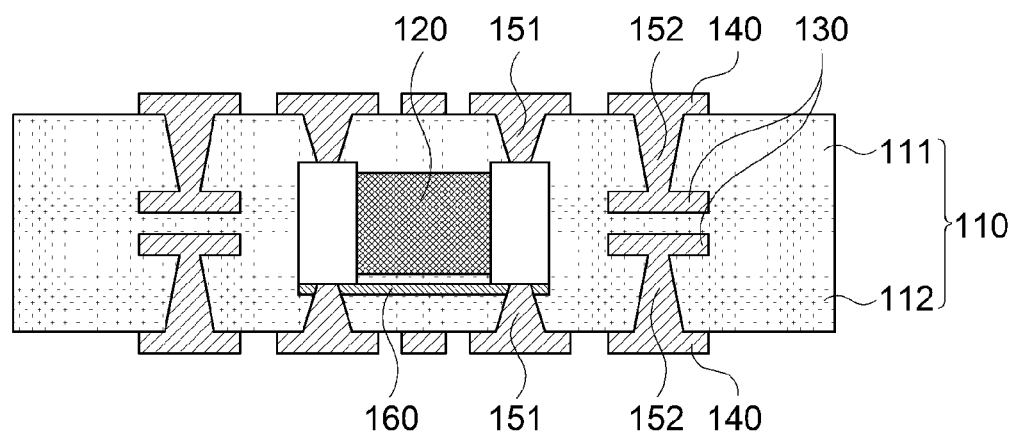
FIG. 4 is a cross-sectional view of a chip embedded substrate according to another exemplary embodiment of the present invention.

FIG. 4 is a cross-sectional view of a chip embedded substrate according to another exemplary embodiment of the present invention. Referring to FIG. 4, the internal circuit patterns 130 formed in the plurality of layers are all disposed between the height of the top surface of the chip 120 and the height of the bottom surface and the internal circuit patterns 130 in the respective layers are spaced apart from each other by a predetermined interval.

As such, the number of internal circuit patterns 130 may be appropriately selected depending on a size of the embedded chip 120 so as to be formed in the plurality of layers. In this case, circuit density may be further increased.

Hereinafter, a method of manufacturing a chip embedded substrate according to the present invention will be described.

Figure 5:
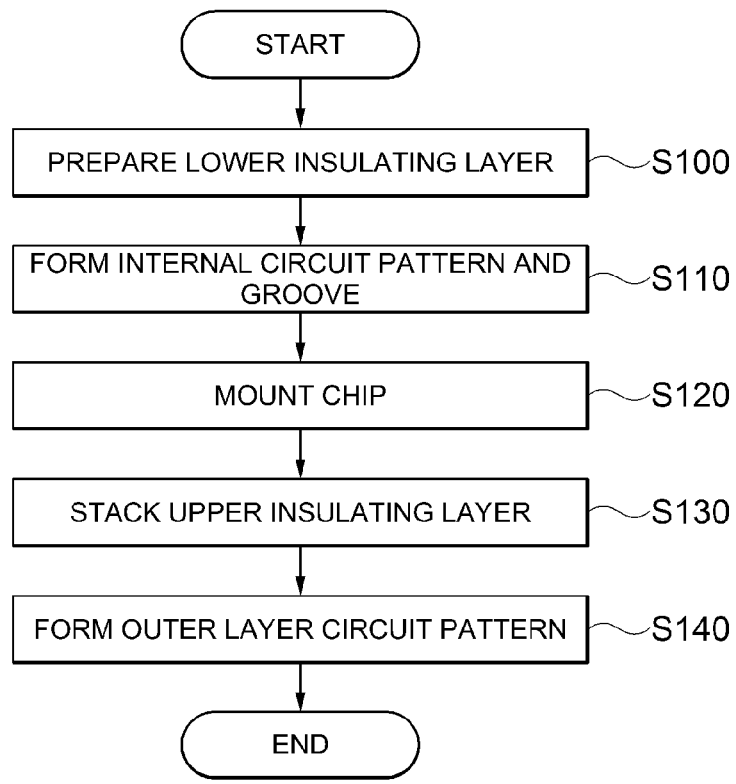
FIG. 5 is a flow chart sequentially illustrating a method of manufacturing a chip embedded substrate according to the present invention.

FIG. 5 is a flow chart sequentially illustrating a method of manufacturing a chip embedded substrate according to the present invention and FIGS. 6 to 10 are cross-sectional views showing the respective processes of FIG. 5.

Figure 6:
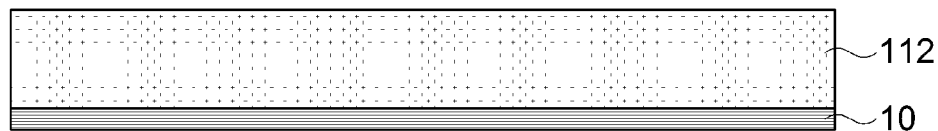
FIGS. 6 to 10 are cross-sectional views showing the respective processes of FIG. 5.

In the method of manufacturing the chip embedded substrate according to the present invention, first, an operation of preparing a lower insulating layer 112 is performed (S100). The lower insulating layer 112 may be attached onto a rigid carrier 10 in order to prevent a warpage occurrence during a manufacturing process (FIG. 6).

Figure 7:
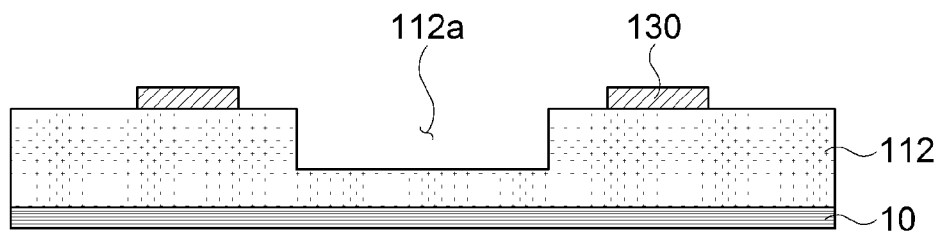

Next, an operation of forming internal circuit patterns 130 and a groove 112a on the lower insulating layer 112 is performed (S110, FIG. 7).

The internal circuit patterns 130 may be formed by using a typical pattern process known in the art, for example, a semi-additive process (SAP), a modified semi-additive process (MSAP), a subtractive process, or the like. In this case, it is preferable to form the groove 112a by disposing a mask, or the like on a region in which the groove is to be formed and then removing the mask once the internal circuit patterns 130 are formed. The reason is that in the case in which the groove 112a is first formed, a metal material may be deposited into the groove at the time of a plating process for the internal circuit patterns 130.

The groove 112a may be formed by using a laser processing, a $CO_2$ processing, an etching, a mechanical drilling, or the like, and the groove 112a is formed so as have a depth smaller than a thickness of the mounted chip 120.

Figure 8:
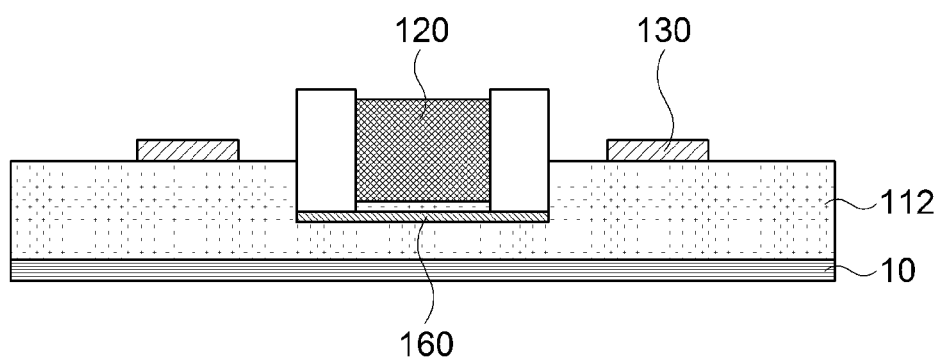

Next, an operation of mounting a chip 120 in the groove 112a of the lower insulating layer 112 is performed (S120). In this case, when an adhesive 160 is attached to a bottom surface of the groove and the chip 120 is then mounted in the groove, the chip 120 may be further firmly fixed (FIG. 8).

Since a depth of the groove 112a is smaller than a thickness of the chip 120, an upper end portion of the chip 120 protrudes to the outside as shown in the drawing.

Next, an operation of stacking an upper insulating layer 111 on the lower insulating layer 112 so as to cover internal circuit patterns 130 and the chip 120 is performed (S130).

Figure 9:
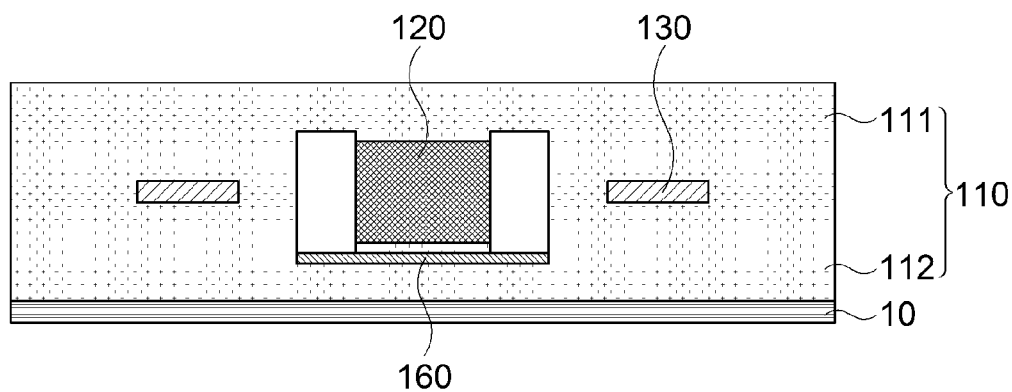
Figure 10:
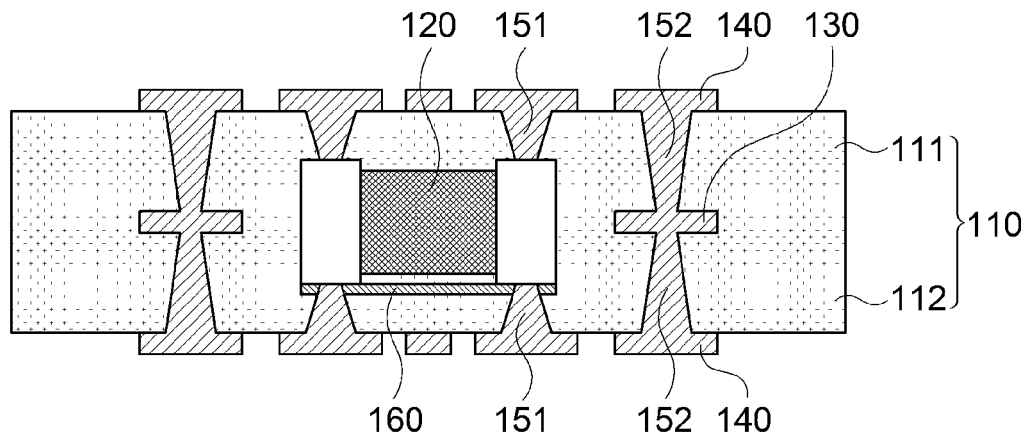

A groove having the same size as that of the lower insulating layer 112 is formed in the upper insulating layer 111 in advance. If the upper insulating layer 111 is bonded so that the upper end portion of the chip 120 is inserted into the groove, then the insulating layer 110 is completed (FIG. 9).

The upper insulating layer 111 is formed of the same resin material as the lower insulating layer 112. Therefore, if the upper insulating layer 111 is compressed at predetermined temperature and pressure, the upper insulating layer 111 and the lower insulating layer 112 are integrated so as not to identify a boundary therebetween.

Finally, an operation of forming outer layer circuit patterns 140 on any one of a lower surface of the lower insulating layer 112 and an upper surface of an upper insulating layer 111 is performed (S140).

The outer layer circuit patterns 140 may be formed by the same process as the internal circuit patterns 130, and after a carrier 10 is removed, a process for the lower insulating layer 112 is performed.

In this case, the first via 151 and the second via 152 may be formed together with the outer layer circuit patterns 140 by processing the via exposing the internal circuit patterns 130 and connection terminals of the chip 120 and then performing a plating process before forming the outer layer circuit patterns 140.

Since the internal circuit patterns 130 and the chip 120 are embedded in the center of the insulating layer 110 at the time of a laser process for a via hole processing, laser may be simultaneously irradiated on the upper surface and the lower surface of the insulting layer 110 by using the internal circuit patterns 130 and the chip 120 as a laser stopper. Therefore, the via hole is processed in a taper shape in which a diameter thereof is decreased toward the internal circuit patterns 130 or the chip 120, and the first via 151 formed in the upper insulating layer 111 and the first via 151 formed in the lower insulating layer 112 after performing the plating process have a symmetrical structure. Similarly, the second via 152 formed in the upper insulating layer 111 and the second via 152 formed in the lower insulating layer 112 also have the symmetrical structure.

The chip embedded substrate 100 according to the present invention may be manufactured by another method. FIGS. 11 to 15 are process cross-sectional views of a method of manufacturing a chip embedded substrate according to another exemplary embodiment of the present invention.

Figure 11:
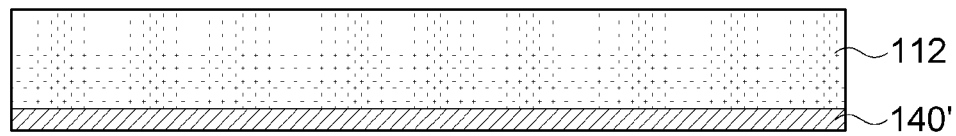
FIGS. 11 to 15 are process cross-sectional views of a method of manufacturing a chip embedded substrate according to another exemplary embodiment of the present invention.
Figure 12:
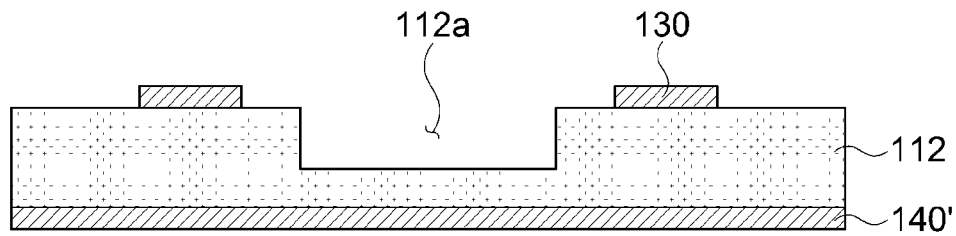

In the method of manufacturing the chip embedded substrate according to another exemplary embodiment of the present invention, first, an operation of preparing a lower insulating layer 112 having a metal layer 140' stacked on a lower surface is performed (FIG. 11). The metal layer 140' supports the lower insulating layer 112 and becomes a fundamental layer of the outer layer circuit patterns 140 at the same time. Therefore, the lower insulating layer 112 may be prepared as a copper clad laminate (CCL) in which a copper foil is formed on one surface of a resin material.

Figure 13:
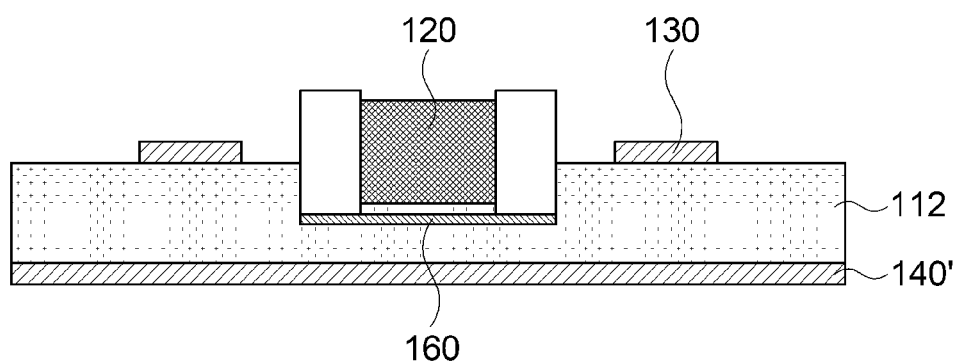
Figure 14:
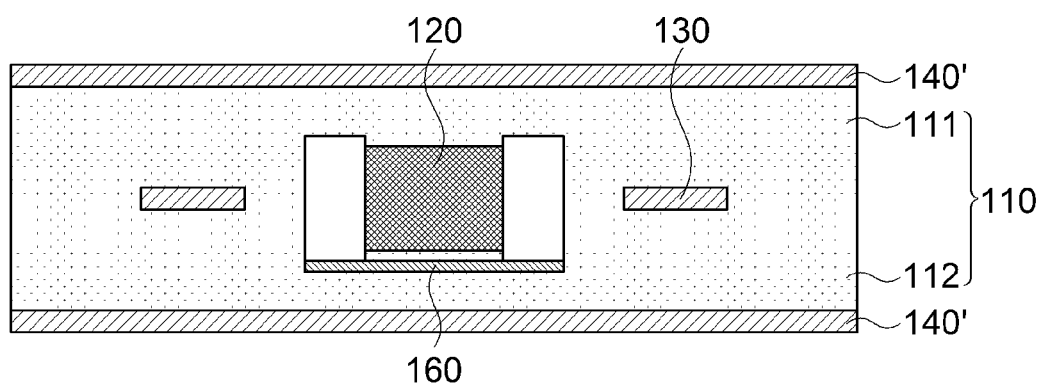

Next, internal circuit patterns 130 and a groove 112a are formed on the lower insulating layer 112 (FIG. 12) and a chip 120 is mounted in the groove. Of course, in the present exemplary embodiment, an adhesive 160 may be attached to a bottom surface of the groove 112a and the chip 120 may be mounted therein (FIG. 13).

Next, an operation of stacking an upper insulating layer 111 on the lower insulating layer 112 so as to cover the internal circuit patterns 130 and the chip 120 is performed (S140). Here, the metal layer 140', which is the fundamental layer of the outer layer circuit patterns 140 may be provided onto the upper surface of the upper insulating layer 111.

Figure 15:
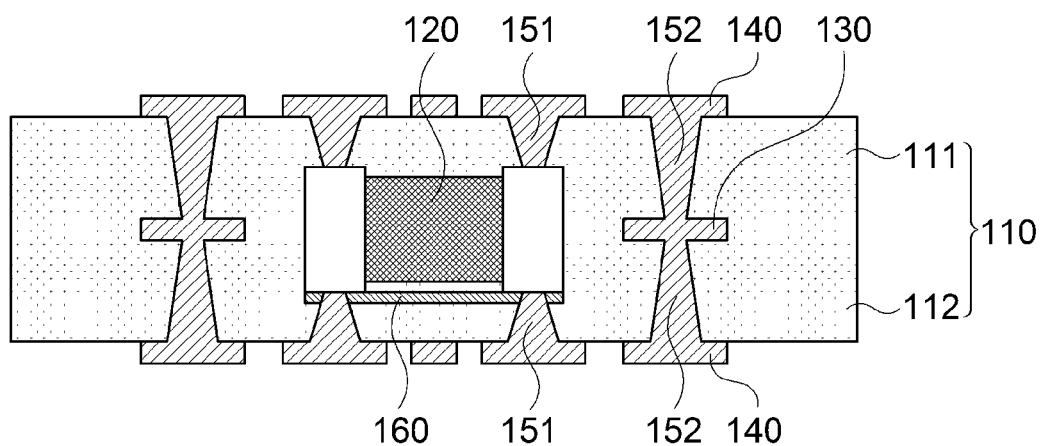

Next, by patterning the metal layer 140' of the lower insulating layer 112 and the metal layer 140' of the upper insulating layer 111 to form the outer layer circuit patterns 140, the chip embedded substrate according to the present invention may be finally completed (FIG. 15).

According to the exemplary embodiment of the present invention, the high density of the circuit may be implemented by designing the internal circuit patterns in the insulating layer in which the chip is embedded.

In addition, since the overall thickness of the substrate is not increased, the slimness and lightness of the product may be met.

The present invention has been described in connection with what is presently considered to be practical exemplary embodiments. Although the exemplary embodiments of the present invention have been described, the present invention may also be used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present disclosure. Therefore, they may be carried out in other states known to the field to which the present invention pertains in using other inventions such as the present invention and also be modified in various forms required in specific application fields and usages of the invention. Therefore, it is to be understood that the invention is not limited to the disclosed exemplary embodiments. It is to be understood that other exemplary embodiments are also included within the spirit and scope of the appended claims.

What is claimed is:

1. A chip embedded substrate comprising:
    an insulating layer having an upper surface and a lower surface opposing each other;
    outer layer circuit patterns disposed on any one of the upper surface or the lower surface;
    a chip embedded in the insulating layer; and
    internal circuit patterns embedded in the insulating layer and disposed on a level between a top surface of the chip and a bottom surface of the chip opposing each other,
    wherein the insulating layer includes an upper insulating layer having a first groove in which an upper end portion of the chip and the top surface of the chip are inserted, and a lower insulating layer having a second groove in which a lower end portion of the chip and the bottom surface of the chip are inserted,
    wherein each of the upper insulating layer and the lower insulating layer is formed as a single layer, and
    wherein the internal circuit patterns are formed between the upper insulating layer and the lower insulating layer.

2. The chip embedded substrate according to claim 1, wherein the internal circuit patterns are formed in a plurality of layers.

3. The chip embedded substrate according to claim 1, further comprising an adhesive provided between the chip and a bottom surface of the second groove of the lower insulating layer.

4. The chip embedded substrate according to claim 1, further comprising a first via electrically connecting the chip and one of the outer layer circuit patterns to each other and having a diameter decreasing from the one of outer layer circuit patterns toward the chip.

5. The chip embedded substrate according to claim 1, further comprising a second via directly, electrically connecting one of the internal circuit patterns and one of the outer layer circuit patterns to each other and having a diameter decreasing from the one of outer layer circuit patterns toward the one of the internal circuit patterns.

* * * * *